United States Patent
Xiang et al.

(10) Patent No.: US 12,092,691 B2
(45) Date of Patent: Sep. 17, 2024

(54) SCAN TREE CONSTRUCTION

(71) Applicant: TSINGHUA UNIVERSITY, Beijing (CN)

(72) Inventors: Can Xiang, Beijing (CN); Dong Xiang, Beijing (CN)

(73) Assignee: TSINGHUA UNIVERSITY, Beijing (CN)

( * ) Notice: Subject to any disclaimer, the term of this patent is extended or adjusted under 35 U.S.C. 154(b) by 0 days.

(21) Appl. No.: 18/115,777

(22) Filed: Mar. 1, 2023

(65) Prior Publication Data

US 2024/0151771 A1    May 9, 2024

(30) Foreign Application Priority Data

Nov. 4, 2022    (CN) .......................... 202211379735.0

(51) Int. Cl.
*G01R 31/3185*    (2006.01)
*G01R 31/28*      (2006.01)
*G01R 31/3183*    (2006.01)

(52) U.S. Cl.
CPC ............... *G01R 31/318536* (2013.01); *G01R 31/2834* (2013.01); *G01R 31/318321* (2013.01); *G01R 31/318335* (2013.01)

(58) Field of Classification Search
CPC ........ G01R 31/318536; G01R 31/2834; G01R 31/318321; G01R 31/318335
See application file for complete search history.

(56) References Cited

U.S. PATENT DOCUMENTS

| | | | | |
|---|---|---|---|---|
| 2003/0056164 A1* | 3/2003 | Lauga | ............ | G01R 31/318536 714/726 |
| 2007/0168797 A1* | 7/2007 | Fredrickson | ... | G01R 31/318552 714/726 |
| 2011/0289369 A1* | 11/2011 | Lee | ................ | G01R 31/318547 714/E11.155 |
| 2013/0159800 A1* | 6/2013 | Ravi | .............. | G01R 31/318547 714/727 |
| 2015/0074478 A1* | 3/2015 | Xiang | ............ | G01R 31/318536 714/727 |
| 2019/0018910 A1* | 1/2019 | Xiang | .............. | G01R 31/31704 |
| 2019/0339328 A1* | 11/2019 | Xiang | ............ | G01R 31/318328 |

* cited by examiner

*Primary Examiner* — Cynthia Britt

(57) ABSTRACT

Scan forest can effectively compress test data volume, however, CPU time and memory consumption must be well-controlled to handle industrial designs. The present disclosure provides a method to establish a scan forest, which reduces memory consumption and CPU time significantly. A new low-power test application scheme is proposed, which does not need to increase the test application cost but can be of help to compress test data volume. Another new test application algorithm is proposed to reduce capture cycle power and shift cycle power by just doubling the test application time, which does not sacrifice the test data compression performance.

12 Claims, 5 Drawing Sheets

SCAN TREE CONSTRUCTION

CROSS REFERENCE TO RELATED APPLICATIONS

The present application claims the benefit of Chinese Patent Application No. 202211379735.0 filed on Nov. 4, 2022, the contents of which are incorporated herein by reference in their entirety.

BACKGROUND

In a digital VLSI (Very Large Scale Integration) circuit, inputs of a logic gate are combinational predecessors of its outputs, while the outputs of the logic gate are combinational successors of its inputs. A combinational predecessor and a combinational successor may be used as the other for iteration. A neighboring combinational predecessor is called a direct combinational predecessor, and a neighboring combinational successor is called a direct combinational successor.

Successor relation and predecessor relation are calculated and recorded in two 2-dimensional matrices, conv[i][j] and pred[i][j], for two scan flip-flops i and j, respectively. The pred[i][j]=1, if the scan flip-flops i and j have common combinational predecessors in the single frame combinational circuit, and the conv[i][j]=1, if the scan flip-flops i and j have common combinational successors in the single frame combinational circuit.

In order to construct the two 2-dimensional matrices, for each scan flip-flop i, IN[i] represents a set of pseudo-primary inputs (PPIs) and primary inputs (PIs) that may reach the scan flip-flop i; OUT[i] represents a set of pseudo-primary outputs (PPOs) and primary outputs (POs) that the scan flip-flop I may output.

For each pair of scan flip-flops i and j, pred[i][j]=1 if IN[i]∩IN[j]≠Φ; otherwise, pred[i][j]=0. conv[i][j]=1 if OUT[i]∩OUT[j]≠Φ; otherwise, conv[i][j]=0.

To implement the above idea, it is required to design two 2-dimensional matrices to record the predecessor and successor relations. For a circuit with one million scan flip-flops, one 2-dimensional matrix requires a memory over 1000 G bits. To design a parallel algorithm for constructing two 2-dimensional matrices, it is hard to implement the two relations.

CPU-efficient and memory-efficient technique is needed to obtain the relations. This is the most important motivation of the present disclosure.

DETAILED DESCRIPTION OF THE EMBODIMENTS

1. Scan Flip-Flop Grouping

Figure 1:
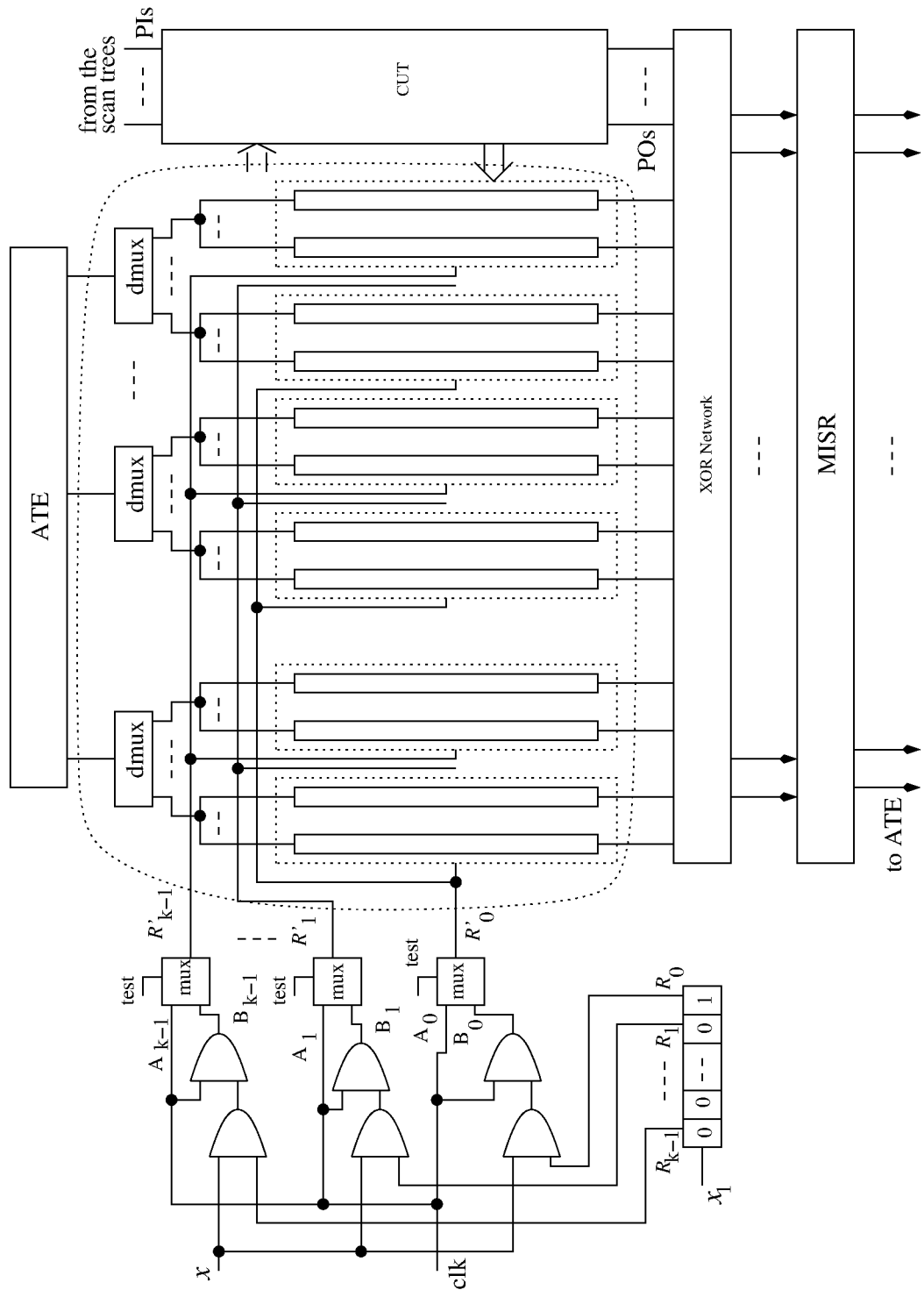
FIG. 1 illustrates a primary forest architecture, a scan input of which is directly driven by ATE.

FIG. 1 illustrates a low-power, CPU and memory-efficient scan forest. The scan forest includes a plurality of scan-in pins, and each of the pins is driven by an ATE (Automatic Test Equipment). The scan forest further includes a plurality of demultiplexers. Each of the scan-in pins is connected to an input of a demultiplexer (DMUX for short) and is used to drive the demultiplexer, and each demultiplexer fanouts multiple outputs and each output feeds a scan tree. One scan tree fed by the same demultiplexer is driven by the same clock signal. All k scan trees, as a group, fed by the same demultiplexer are controlled by k separate clock signals, respectively.

Scan forest for single stuck-at faults is a key component for test compression. Each fanout pin from the same demultiplexer drives multiple scan chains (which constructs a scan tree): $(c_{1,1}, c_{1,2}, \ldots, c_{1,d}), (c_{2,1}, c_{2,2}, \ldots, c_{2,d}), \ldots, (c_{g,1}, c_{g,2}, \ldots, c_{g,d})$, d and g are a depth of the scan tree and the number of scan chains in each scan tree (a group size, closely related to the compression ratio). Each pair of scan flip-flops in $(c_{1,1}, c_{2,1}, \ldots, c_{g,1}), (c_{1,2}, c_{2,2}, \ldots, c_{g,2}), \ldots, (c_{1,d}, c_{2,d}, \ldots, c_{g,d})$ is required to not have any common combinational successor in the single-frame combinational circuit.

The CPU time and memory efficient scan forest construction algorithm 1 may be described as follows.

(1) A parameter g is set to represent a size of a scan flip-flop group, i.e., the number of scan chains driven by the same output of the DMUX.

(2) A current scan flip-flop set Q comprising a plurality of scan flip-flops, and an unprocessed scan flip-flop set U are provided; and the following (2a) to (2d) are performed until the scan flip-flop set Q is empty, to group scan flip-flops in the scan flip-flop set Q, thereby obtaining a plurality of flip-flop groups.

(2a) A scan flip-flop f is taken from Q and is put into a scan flip-flop group set $Q_1$, and a set of PPO and Po of the scan flip-flops OUT[f] is calculated, which is reachable from f via a combinational path. The OUT[f] represents a set of pseudo-primary outputs (PPOs) and primary outputs (POs).

(2b) When the number of Q1, $|Q_1|<g$, the (2c) and (2d) are performed.

(2c) A scan flip-flop $f_1$ is taken randomly from U; and whether $f_1$ converges with any one scan flip-flop in $Q_1$ is checked, if $f_1$ converges with no one scan flip-flop in Q1, $f_1$ is put into $Q_1$; and otherwise, $f_1$ is put into the set of unprocessed scan flip-flops U.

(2d) A scan flip-flop $f_1$ is taken randomly from Q; and whether $f_1$ converges with any one scan flip-flop in $Q_1$ is checked, if $f_1$ converges with no one scan flip-flop in Q1, $f_1$ is put into $Q_1$; and otherwise, the set of PPO and PO of the scan flip-flops OUT[$f_1$] is recorded. The scan flip-flops are reachable from $f_1$, and $f_1$ is put into the unprocessed scan flip-flop set U; and the (3) is performed when the Q is empty.

(3) The scan forest is constructed in the following way (3a) to (3c).

(3a) The numbers of external and internal scan chains $c_e$ and $c_i$ for the design for test architecture, and k for the gating logic (a fanout factor for the demultiplexer) are determined; and the depth of the scan tree d is determined according to the number of scan flip-flops, k, $c_e$ and $c_i$.

(3b) The scan trees are constructed from left to right as follows: randomly taking a scan flip-flop group $G_1$, and sequentially putting the g scan flip-flops in the G1 as the first scan flip-flops for the k scan chains of the first scan tree, respectively.

(3c) Another scan flip-flop group $G_2$ is randomly taken, and g scan flip-flops in $G_2$ are sequentially connected to the g scan chains according to the physical locations for connection reduction; the above process are repeated until the first scan tree has been established; and steps (3b) and (3c) are repeated until all scan trees have been established.

It is not necessary for algorithm 1 to record a big 2-dimensional matrix. Therefore, the memory complexity is approximately linear. It is also not necessary to calculate the reachability functions repeatedly for each scan flip-flop, which keeps the set of PPOs or POs that are reachable for the scan flip-flops. Therefore, the CPU time can be well-controlled. To search for the set of PPOs or POs, it is required to search the sub-circuit that is reachable from the PPI of the scan flip-flop, and the CPU time for this can be extremely low.

The worst case of memory consumption for algorithm 1 is that the functions OUT[i] of all the scan flip-flops need to be stored at the same time, and the size of the functions OUT[i] is far less that of all the scan flip-flop. In most cases, the memory consumption can be far less than that to store all the functions OUT[i] for the scan flip-flops. FIG. 1 illustrates the total primary forest architecture, and the scan-in pins from the ATE drives scan trees directly.

2. Test Response Compaction

The scan trees driven by the same clock signal establishes an XOR network. Test responses are compacted as follows: a subset of scan chains $(c_{1,1}, c_{1,2}, \ldots, c_{1,d})$, $(c_{2,1}, c_{2,2}, \ldots, c_{2,d})$, ..., $(c_{g,1}, c_{g,2}, \ldots, c_{g,d})$ may be connected to the same XOR tree if any pair of scan flip-flop subsets $\{c_{1,1}, c_{2,1}, \ldots c_{g,1}\}$, $\{c_{1,2}, c_{2,2}, \ldots, c_{g,2}\}$, ..., and $\{c_{1,d}, c_{2,d} \ldots c_{g,d}\}$ do not have any combinational predecessor. Test responses can be well-compacted in this way.

It is required to calculate a function IN[i] for each scan flip-flop i, and the function IN[i] is a set of PPIs and PIs that may reach i. When a scan chain cannot be connected to an XOR network, the functions IN[i] for all related scan flip-flops are remained until the scan chain is connected to another XOR network. It saves a lot of CPU time by using the above scheme.

To keep the function IN[i] for a scan flip-flop i, the function IN[i] includes a subset of scan flip-flops. The size of the function IN[i] is much less than the number of all the scan flip-flops NSFF, which is even far less 1% of the number of all the scan flip-flops in many cases. To keep the functions IN[i] for all the scan flip-flops, the memory consumption is far less than $NSFF^2$.

Figure 2:
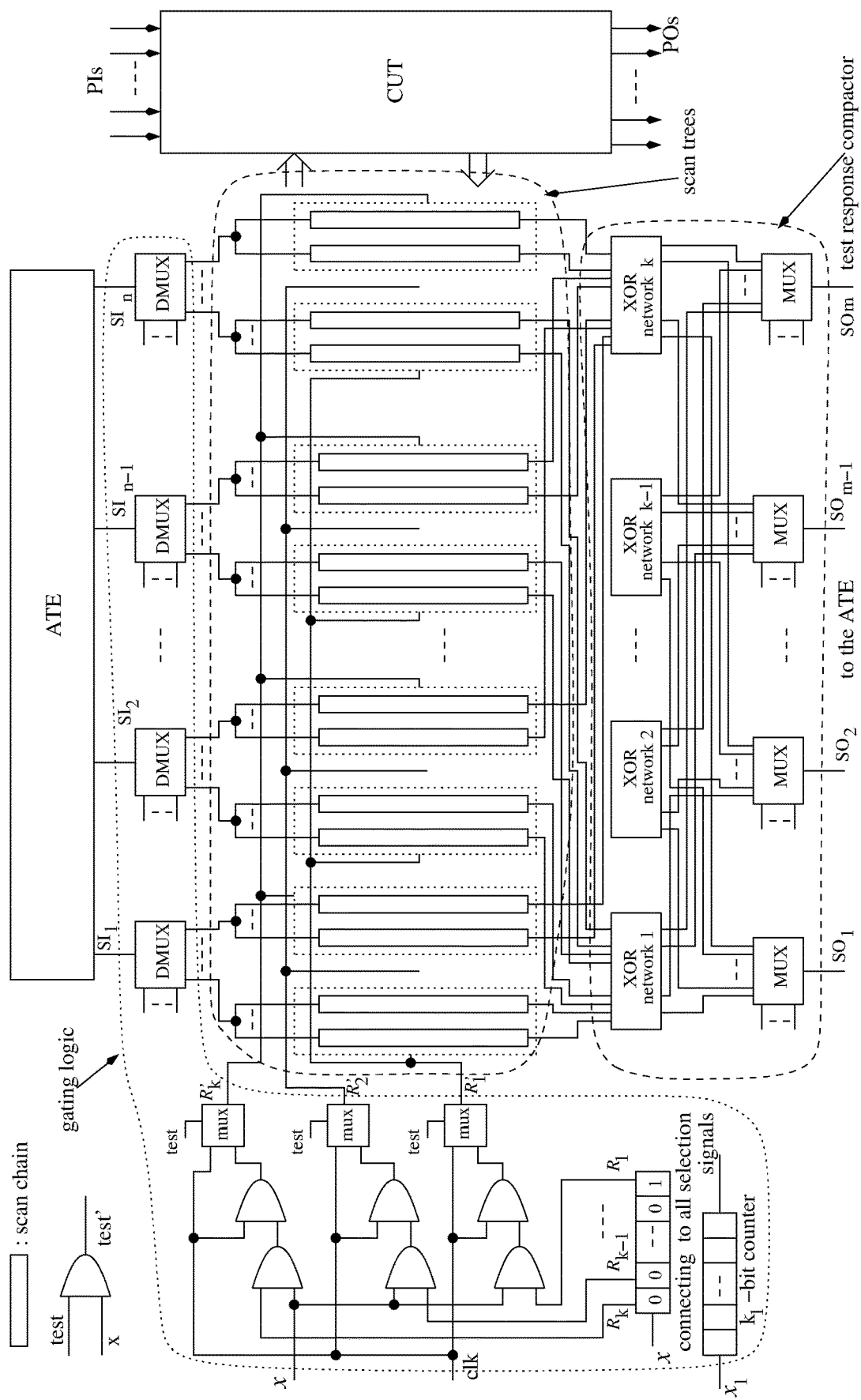
FIG. 2 illustrates a scan forest with a decompressor.

FIG. 2 illustrates a test compression architecture used by the present disclosure. Scan trees driven by the same clock signal are connected to the XOR network. Assume that the k XOR networks have outputs, $O_1, O_2, \ldots, O_k$, respectively. The number of outputs for all the test response compactors is m, where $m=\max\{O_1, O_2, \ldots, O_k\}$. Each output of the test response compactor is connected to one of the m MUXs as shown in FIG. 2. The extra pins to control the MUXs are the same as that for the DMUXs, and may be connected to an extra register and be reduced to 1.

3. Low-Power Test Application Scheme

The low-power test application scheme is stated as follows.

Algorithm 2 (Low-Power Test Application)

(1) Algorithm 1 is called to establish the scan forest in the circuit; and a test set T for the scan forest in the designed circuit is generated.

(2) When T is not empty, a test t is taken from T, and the following processes are performed by the repeater function of the ATE.

(3) 00 . . . 01 is delivered into the extra register of the gating logic and the first group of scan tree is activated.

(4) The test data is shifted into the first group of scan tree and the test responses of the previous test is shifted out simultaneously.

(5) The extra register is shifted a bit to left; the test data t is shifted into the second subset of activated scan trees when shifting out the test responses of the previous test; and the above process in step (5) is repeated until all k groups of scan trees have received test data t.

(6) all the scan flip-flops capture test responses for test t when all the scan flip-flops are set into the functional mode.

The low-power test application scheme based algorithm 2 is implemented by using the DFT architecture as shown in FIG. 1. A new gating technique as presented in the figure is implemented by using an extra register. The sequence 00 . . . 01 is shifted into the extra register, only one k-th scan trees are activated in any case. After the test data have been shifted into all activated scan trees, the extra register is shifted a bit to left. The test data are shifted into the activated scan trees in the second subset by using the repeater function of the ATE. The test data shifted into the first subset of scan trees are disabled when the test data are shifted into the second subset of scan trees. This process continues until all scan flip-flops have received test data. All scan flip-flops are set to the functional mode to capture test responses. Similarly, all other tests are shifted in and test responses are captured. This scheme reduces shift power instead of capture power. Test application cost based on algorithm 2 is estimated as follows:

$$TA=(k \cdot d+1) \cdot vec$$

where k, d and vec are the key parameter for the gating technique, the depth of the longest scan tree, and the number of tests, respectively.

The test application to reduce capture power for designs with the scan trees established is described as follows.

Algorithm 3 (Low-Power Test Application to Reduce Both Shift and Capture Power)

(1) When T is not empty, (2)-(6) are performed.

(2) For t∈T, t is deleted from T, the following processes are performed by using the repeater function of the ATE, the extra register of the gating logic is set to 00 . . . 01, and the first subset of scan trees (which contains a single scan tree driven by each of the DMUXs) is activated.

(3) The test data of test shift into the first activated subset of scan trees.

(4) The extra register of the gating logic is shift a single bit to left, the test data is shift into the activated subset of scan trees and the test responses of the previous test are shift out; the process in step (4) is repeated until all k subsets of scan trees have received test data of t; and the test responses of the previous test for the last subset of scan trees are shift out when shifting in the test data t.

(5) The extra shift register is set to 00 . . . 01, the first subset of scan trees is set into the functional mode and capture test responses of t; and the test data t is shift into the first activated subset of scan trees again.

(6) A bit for the extra shift register of the gating logic is shift to the left, the second subset of scan trees are activated which receive test responses; the test data t is shifted into the activated subset of scan trees; the above processes are performed until all subsets of scan trees have received test responses of test t.

Algorithm 3 is proposed based on the DFT architecture as shown in FIG. 1. Algorithm 3 presents the gating logic, which activates only a small part of scan chains in any case. An extra shift register is inserted to implement the low-power test application scheme by using the repeater function of the ATE, which reduces both shift and capture power. The sequence 00 . . . 01 is loaded into the extra shift register first, which activates the first part of scan chains. In any scan shift cycles, only 1/k scan chains are activated. After the test data have been shifted into the activated scan chains, the values in the extra register is shifted a bit to the left, and is 00 . . . 10 now. The scan trees in the second subset are activated while the test data are shifted into the activated scan trees. In this process, all scan trees in the first subset are disabled. This process continues until all scan flip-flops have received test data. Up to now, the whole process is exactly the same as that in algorithm 2.

Different response capture schemes are used for algorithm 3 compared to algorithm 2. Algorithm 3 allows different subsets of scan trees capture test responses separately. First subset of scan trees captures test responses when the extra shift register is set to 00 . . . 01. The test data for the first subset of scan trees are shifted into the first subset of scan trees again. The extra shift register is then shift a bit left while the second subset of scan trees is activated. The activated scan trees capture test responses. The test data are again shifted into the second subset of scan trees. This process continues until the last subset of scan trees in the last subset has captured test responses. The test data are not required shifting into the scan trees in the last subset again. The test data are shifted into the scan trees twice except the last subset, and each subset of scan trees captures test responses twice. Test application cost TA can be estimated as follows:

$$TA=[(2k-1)\cdot d+k]\cdot vec$$

where k is the key parameter for the gating technique (the fanout factor of the DMUXs), d is the depth of the longest scan tree, and vec is the number of test vectors. The shift power and capture power can be reduced to approximately 1/k, when the test application cost is about doubled compared to that of Algorithm 2.

4. Low-Power Test Application for the DFT Architecture with a Decompressor

Figure 3:
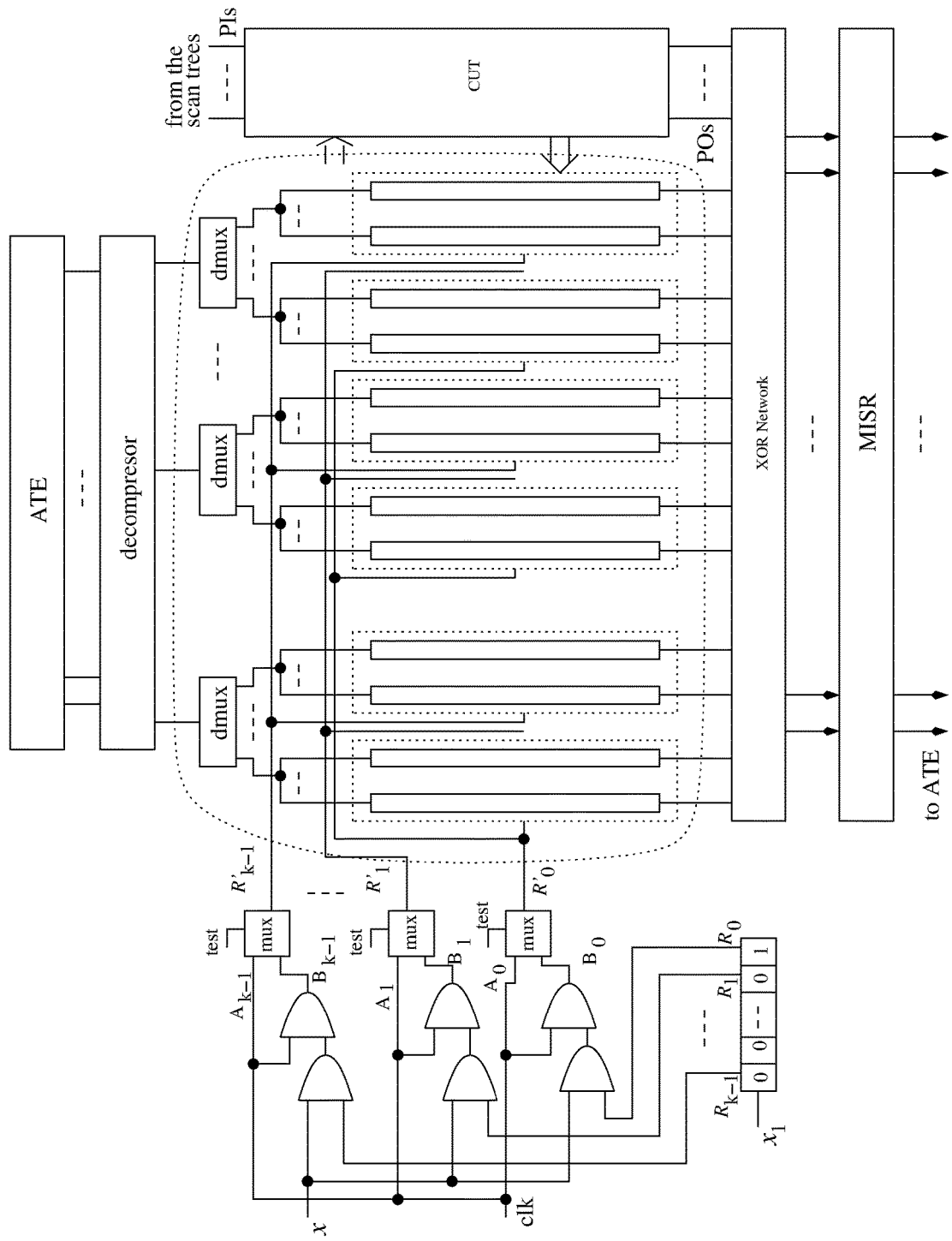
FIG. 3 illustrates a scan forest with a decompressor.
Figure 4:
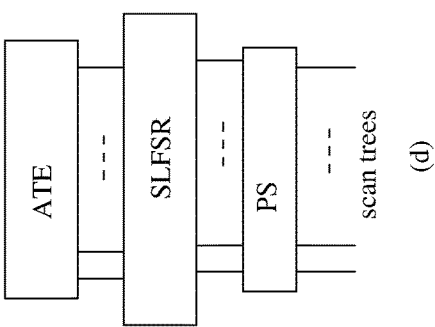
FIG. 4 illustrates a DFT architecture including: (a) without a decompressor, and with a decompressor: (b) LFSR, (c) ring generator, and (d) the software-defined LFSR.
Figure 4:
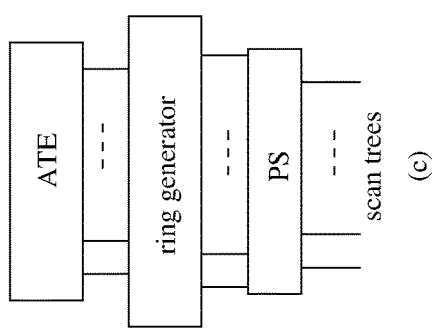
Figure 4:
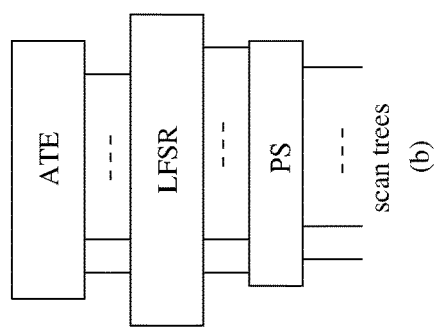
Figure 4:
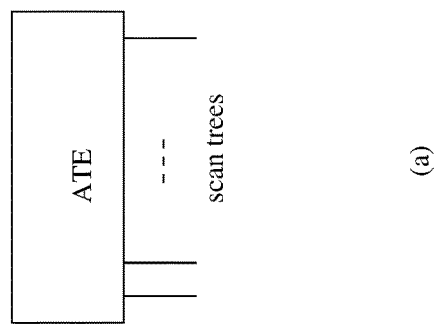

The low-power test application scheme for the DFT architectures with a decompressor may be stated as follows. As shown in FIG. 3, the ATE just provides the seeds and inputs of the external scan-in pins via a decompressor (e.g., a linear-feedback shift register (LFSR), a ring generator, or a software-defined LFSR (SLFSR)). The LFSR/ring generator/SLFSR drives the phase shifter (PS). Each output of the PS drives the input of a demultiplexer, where the demultiplexer drives a number of scan trees. Each scan tree from the same demultiplexer is controlled by a separate clock signal. The decompressor may be a linear-feedback shift register, LFSR, as shown in (b), a ring generator as shown in (c), or a software-defined LFSR, SLFSR as shown in (d), in FIG. 4. A demultiplexer drives k separate scan trees.

Figure 5:
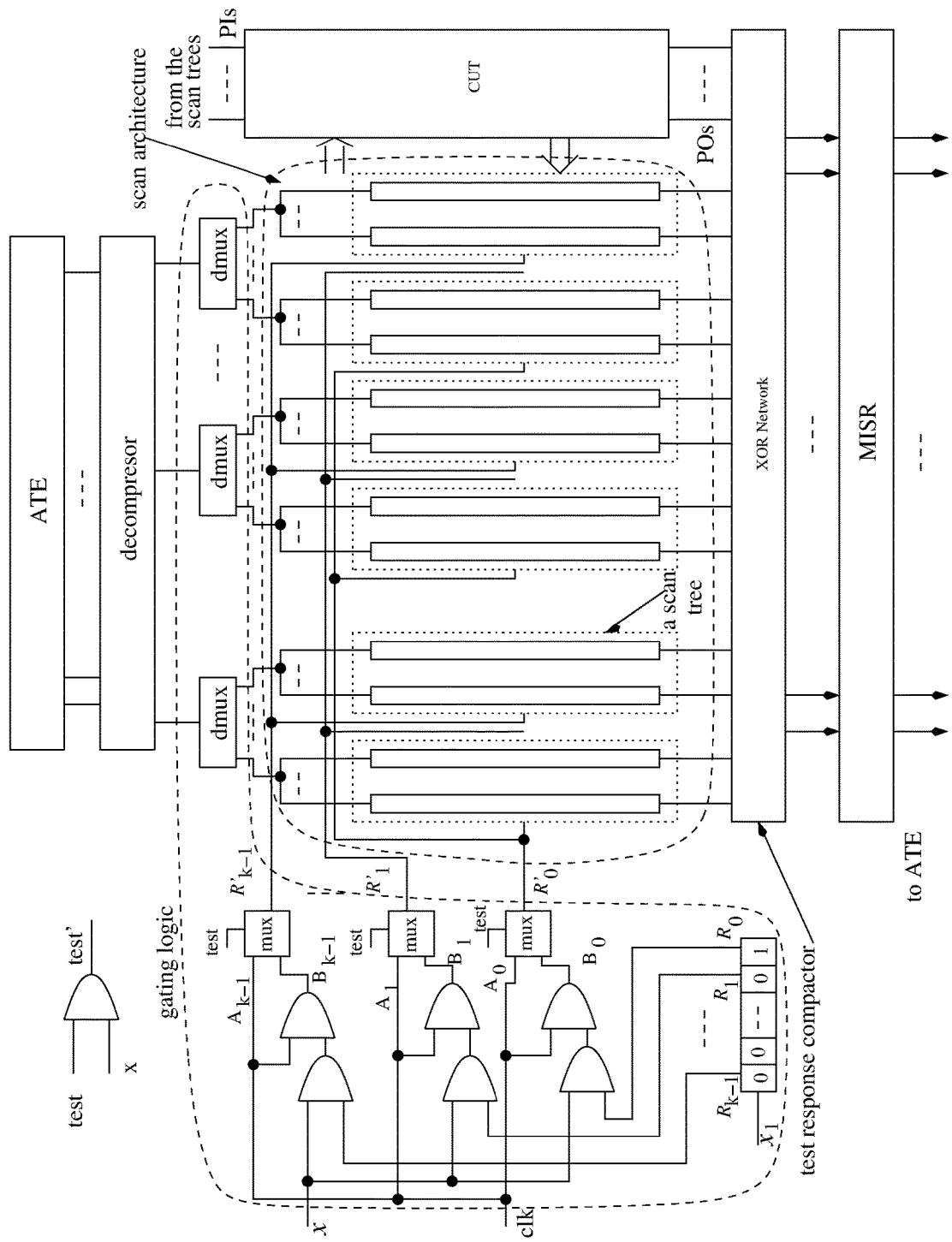
FIG. 5 illustrates a DFT architecture to reduce both shift and capture power.

The clock signals can be slightly modified as shown in FIG. 5 by revising the scan enable signal test to the test' signal. The test' signal is the output of the 2-input AND gate, one input of the AND gate is the original scan enable signal test, the other is x. Here, x=1 for the entire test process, and x=0 for the functional mode.

The low-power test application algorithm for the designs with the design for testability (DFT) architecture combining a decompressor is stated as follows.

Algorithm 4 (Low-Power Test Application for DFT Architectures with a Decompressor)
(1) Tests for the scan tree designed circuit are generated, and the generated tests are set to be T.
(2) When T is not empty, the following is performed.
(3) The extra shift register of the gating logic is set to 00 . . . 01 to activate the first subset of scan trees, where each test t∈T, t is deleted from T, and (4)-(7) are performed with the repeater function of the ATE.
(4) The seed of t is generated and loaded into the decompressor.
(5) The test data of the test t is shifted into the first subset of scan trees while shifting in the test data of the extra scan-in pins, and the test responses of the previous test are shifted out simultaneously.
(6) The extra register is shifted a bit left; the test data of the test t is shifted into the current activated subset of scan trees; and the step (6) is repeated until all scan tree subsets have received the test data of the test t.
(7) All scan flip-flops are set to the functional mode to receive test responses of the test t.

The low-power test application scheme based algorithm 2 is implemented by using the DFT architecture as shown in FIG. 3. A new gating technique as presented in the figure is implemented by using an extra register. For each test t, the seed of the test t is loaded into the decompressor first. The sequence 00 . . . 01 is shifted into the extra register, and only one k-th scan trees are activated in any case. After the test data have been shifted into all activated scan trees, the extra register is shifted a bit left. The test data are shifted into the activated scan trees in the second subset by using the repeater function of the ATE. The test data shifted into the first subset of scan trees are disabled when the test data are shifted into the second subset of scan trees. This process continues until all scan flip-flops have received test data. All scan flip-flops are set to the functional mode to capture test responses. Similarly, all other tests are shifted in and test responses are captured. This scheme reduces shift power instead of capture power. Test application cost based on algorithm 2 is estimated as follows:

$$TA=(k\cdot d+l+1)\cdot vec+k\cdot d$$

where k, d, l and vec are the key parameter for the gating technique, the depth of the longest scan tree, the size of the decompressor (LFSR, ring generator, or SLFSR) and the number of tests, respectively. The last term vec shows the number of clock cycles to shift out the test responses of the last vector.

The DFT architecture is allowed to include a decompressor, and the test application algorithm that reduces capture power is stated as follows.

Algorithm 5 (Low-Power Test Application to Reduce Both Shift and Capture Power for DFT Architectures with a Decompressor)
(1) When the test set T is not empty, and the steps (2)-(6) are performed.
(2) The low-power test application is completed by using the repeater function of the ATE, and the extra register of the gating logic is set to 00 . . . 01 to activate the first subset of scan trees.
(3) The first subset of scan trees are activated, the test data is shifted into the activated subset of scan trees when shifting in the data of the external scan-in pins.

(4) The extra shift register of the gating logic is shifted a bit left; the test data is shifted into the second subset of scan trees when shifting in the test data of t via the external scan-in pins; the process in step (4) is repeated until all k subsets of scan trees have received the test data of t; the test responses of the previous test is shifted out when shifting in the test data for the last subset of scan trees.

(5) All scan flip-flops are disabled, the seed of the test t is shifted into the decompressor in the following consecutive l clock cycles.

(6) The extra register of the gating logic is set to 00 . . . 01, the first subset of scan trees is activated to capture test responses, and the test data of the test t is shifted into the first subset of scan trees again when shifting the test data of the external pins.

(7) The extra register of the gating logic is set to 00 . . . 10, the second subset of scan trees is activated to capture test responses, the test data of the test t is shifted into the first subset of scan trees again when shifting the test data of the external pins; and the above process is repeated until all subsets of scan trees have captured test responses.

Algorithm 5 is proposed based on the DFT architecture as shown in FIG. 1, and presents the gating logic, which activates only a small part of scan chains in any case. An extra shift register is inserted to implement the low-power test application scheme by using the repeater function of the ATE, which reduces both shift and capture power. The seed of the test t is shifted into the LFSR/ring-generator/SLFSR first. The sequence 00 . . . 01 is loaded into the extra shift register first, which activates the first part of scan chains. In any scan shift cycles, only 1/k scan chains are activated. After the test data have been shifted into the activated scan chains, the values in the extra register is shifted left a bit, and is 00 . . . 10 now. The scan trees in the second subset is activated while the test data are shifted into the activated scan trees. In this process, all scan trees in the first subset are disabled. This process continues until all scan flip-flops have received test data. Up to now, the whole process is exactly the same as that in algorithm 3.

Different response capture schemes are used for algorithm 3 compared to algorithm 4. Algorithm 5 allows different subsets of scan trees capture test responses separately. The seed of the test t is reloaded into the decompressor. First subset of scan trees captures test responses when the extra shift register is set to 00 . . . 01. The test data for the first subset of scan trees are shifted into the first subset of scan trees again. The extra shift register is then shift a bit left while the second subset of scan trees is activated. The activated scan trees capture test responses. The test data are again shifted into the second subset of scan trees. This process continues until the last subset of scan trees in the last subset has captured test responses. The test data are not required shifting into the scan trees in the last subset again. The test data are shifted into the scan trees twice except the last subset, and each subset of scan trees captures test responses twice. Test application cost TA can be estimated as follows:

$$TA=[(2k-1)\cdot d+k+2\cdot l]\cdot vec+k\cdot d.$$

where k is the key parameter for the gating technique (the fanout factor of the DMUXs), d is the depth of the longest scan tree, and vec is the number of test vectors. The shift power and capture power can be reduced to approximately 1/k, when the test application cost is about doubled compared to that of Algorithm 4.

The term k d represents the number of clock cycles to shift out the test responses of the last test vector. The term $(2k-1)\cdot d+k+2\cdot l$ represents the number of cycles to apply a test, $(2k-1)\cdot d$ represents the scan shift cycles for the first low-power shift-in period and the low-power capture period, k represents the k capture cycles, and 2·l stands for the number of clock cycles for twice seed loading, here l is the size of the LFSR/SLFSR. It is not necessary to shift in the test data again to the last subset of scan trees after capturing test responses.

The invention claimed is:

1. A scan forest, comprising: a plurality of scan trees and at least one demultiplexer, wherein
   each of the plurality of scan trees comprises a plurality of scan chains, each of the scan chains in the same scan tree comprises a plurality of flip-flops in series, and the scan chains in the same scan tree are configured to receive the same input signal and are controlled by the same logic control signal;
   each demultiplexer drives a group of scan trees;
   different demultiplexers are connected to different groups of scan trees, respectively;
   each of the groups of scan trees has the same number of scan trees;
   the scan trees in the same group are controlled by different logic control signals, respectively; and
   the scan trees at corresponding positions in respective different groups of scan trees are controlled by the same logic control signals;
   wherein, the scan forest is constructed by:
   (1) setting a parameter g for representing the number of scan chains in one scan tree;
   (2) providing a current scan flip-flop set Q comprising a plurality of scan flip-flops, and an unprocessed scan flip-flop set U; and performing the following (a) to (d) until the scan flip-flop set Q is empty, to group scan flip-flops in the scan flip-flop set Q, thereby obtaining a plurality of flip-flop groups:
   in a case where the scan flip-flop set Q is not empty:
   (2a) taking a scan flip-flop f out from Q randomly, putting f into a scan flip-flop group set $Q_1$, and calculating an OUT[f] reachable from f, wherein the OUT[f] represents a set of pseudo-primary outputs (PPOs) and primary outputs (POs);
   (2b) in a case of $|Q_1|<g$, performing (2c) and (2d);
   (2c) taking a scan flip-flop $f_1$ out from U, and checking whether $f_1$ converges with any one of scan flip-flops in $Q_1$, in a case where $f_1$ converges with none of scan flip-flops in Q, putting $f_1$ into $Q_1$; and in a case where $f_1$ converges with any one of scan flip-flops in Q, putting $f_1$ into U;
   (2d) taking $f_1$ out from U, checking whether $f_1$ converges with any one of scan flip-flops in $Q_1$, in a case where $f_1$ converges with none of scan flip-flops in $Q_1$, putting $f_1$ into $Q_1$; and in a case where $f_1$ converges with any one of scan flip-flops in $Q_1$, recording OUT[$f_1$] reachable from $f_1$, and putting $f_1$ into U;
   (3) constructing the scan forest in the following (3a) to (3c):
   (3a) determining the number of external scan-in pins $c_e$, the number of internal scan-in pins $c_i$, and k for gating logic; and determining a depth of a scan tree d according to k, $c_e$ and $c_i$;
   (3b) constructing the scan tree from left to right as follows: randomly taking a scan flip-flop group $G_1$, sequentially putting g scan flip-flops as first scan flip-flops for k scan chains of a first scan tree;

(3c) randomly taking another scan flip-flop group $G_2$, sequentially connecting to the g scan chains, and repeating the above until the first scan tree is established; repeating steps (2 and (3 until all scan trees are established.

2. The scan forest of claim 1, further connecting to a decompressor, wherein the decompressor drives the demultiplexers.

3. A design for testability circuit, comprising the scan forest of claim 2, wherein the testability circuit further comprises: a logic combinational circuit (CUT) connected to the plurality of scan trees to receive test signals from the plurality of scan trees, and feed the test responses back to the CUT.

4. The design for testability circuit of claim 3, further comprising: an XOR-gate network called a phase shifter (PS) connected to multiplexers and primary inputs of the combinational logic circuit.

5. The scan forest with the design for testability circuit of claim 3, further comprising: a plurality of test response compactors constructed by an XOR network for test compaction, wherein the output signals of the scan trees controlled by the same clock signal are input to test response compactor.

6. The scan forest with the design for testability circuit of claim 5, wherein each of a plurality of test response compaction networks (XOR networks) is constructed based on a XOR gate, and two scan chains in the scan trees are connected to the same XOR gate, and any pair of flip-flops at the same level have no common combinational predecessor.

7. The scan forest with the design for testability circuit of claim 6, wherein the test response compactor further comprises: at least one multiplexer connected to the plurality of test response compaction networks, respectively.

8. The scan forest of claim 2, wherein the decompressor is selected from a group of a regular linear feedback shift register, a ring generator, or a software-defined linear feedback shift register.

9. A scan testing method of the scan forest of claim 1, comprising: providing a test set T, performing the following (1) to (5) until T is empty;

(1) taking a test t from T, and performing the following processes in (2) to (5) with the repeater function of an ATE:

(2) delivering k bits of 00 . . . 01 into an extra register of a gating logic and activating the first subset of scan trees;

(3) shifting test data into the first subset of scan trees and shifting out a test response of the previous test simultaneously;

(4) shifting the extra register left a bit, and shifting the test data of t into a second subset of activated scan trees when shifting out the test response of the previous test; repeating (4) until all k subsets of scan trees have received the test data of t; and (5) capturing, by all scan flip-flops, test responses for the test t when all scan flip-flops are set into a functional mode.

10. A scan testing method of the scan forest of claim 1, comprising:

(1) providing a test set T, T being not empty, and for a test t∈T, taking t from T, and performing the following with repeater function (2) to (6) of an ATE;

(2) setting an extra register of a gating logic to k bits of 00 . . . 01, and activating a first subset of scan trees which contains a single scan tree driven by each of demultiplexers (DMUXs), wherein the each of demultiplexers is connected to a scan tree group;

(3) shifting test data of the test t into the first subset of scan trees activated;

(4) shifting the extra register of the gating logic left a single bit, shifting the test data into a current activated subset of scan trees and shifting out test responses of a previous test; continuing step (4) until all k subsets of scan trees have received test data of t; shifting out the test responses of a previous test for a last subset of scan trees when shifting in the test data of t;

(5) setting the extra register to k bits of 00 . . . 01, setting the first subset of scan trees into a functional mode and capturing test responses of t; shifting the test data of t into the first subset of scan trees activated again;

(6) shifting left a bit for the extra shift register of the gating logic, activating a second subset of scan trees for receiving test responses; shifting the test data of t into the subset of scan trees activated; continuing the above process until all subsets of scan trees have received test responses of test t.

11. A scan testing method of the scan forest of claim 1, comprising:

(1) generating a test set T for scan trees, T being not empty;

(2) setting an extra shift register of a gating logic to k bits of 00 . . . 01 to activating a first subset of scan trees, for each test t∈T, taking t out from T, performing the following (3)-(5) with repeater function of an ATE;

(3) shifting test data of the test t into a first subset of scan trees while shifting out test responses of a previous test;

(4) shifting the extra register a bit left; shifting the test data of the test t into a current activated subset of scan trees; repeating step (4) until all subsets scan of trees have received the test data of the test t;

(5) setting all scan flip-flops to a functional mode to receive test responses of the test t.

12. A scan testing method of the scan forest of claim 1, comprising:

(1) providing a test set T, T being not empty, and performing the following (2)-(6) with repeater function of an ATE;

(2) setting an extra register of a gating logic to k bits of 00 . . . 01 to activate a first subset of scan trees;

(3) shifting test data of the test t in the set T into the subset of scan trees activated when the data of external scan-in pins of a decompressor is shifted, wherein the decompressor is connected to demultiplexers, each of the demultiplexers is connected to a group of scan trees;

(4) shifting the extra shift register of the gating logic a bit left; shifting test data into a second subset of scan trees when shifting in the test data of t via the external scan-in pins; continuing (4) until all k subsets of scan trees have received the test data of t; shifting out test responses of a previous test when the test data for the last subset of scan trees is shifted in;

(5) disabling all scan flip-flops, shifting seeds of the test t into a decompressor in following consecutive/clock cycles;

(6) setting the extra register of the gating logic to k bits of 00 . . . 01, activating the first subset of scan trees to capture test responses, and shifting the test data of the test t into the first subset of scan trees again when the test data of the external pins is shifted;

(7) setting the extra register of the gating logic to k bits of 00 . . . 10, activating the second subset of scan trees to capture test responses, and shifting the test data of the test t into the first subset of scan trees again when the test data of the external pin is shifted; continuing the above until all subsets of scan trees have captured test responses.

\* \* \* \* \*